United States Patent [19]
Yeap

[11] Patent Number: 5,825,644
[45] Date of Patent: Oct. 20, 1998

[54] METHOD FOR ENCODING A STATE MACHINE

[75] Inventor: Gary K. Yeap, Gilbert, Ariz.

[73] Assignee: Motorola, Inc., Schaumburg, Ill.

[21] Appl. No.: 610,299

[22] Filed: Mar. 4, 1996

[51] Int. Cl.$^6$ ........................................................ G06F 3/00
[52] U.S. Cl. ........................ 364/141; 364/488; 364/489;
364/243; 364/244; 375/500; 340/825.83
[58] Field of Search .................................. 364/141, 488,
364/489, 243, 244; 371/22.1; 395/500,
185.03; 340/825.83

[56] References Cited

U.S. PATENT DOCUMENTS

| | | | |
|---|---|---|---|
| 4,556,976 | 12/1985 | Howarth | 371/22.1 |
| 4,663,545 | 5/1987 | Pumo et al. | 326/105 |
| 4,718,087 | 1/1988 | Papamichalis | 381/34 |
| 4,749,929 | 6/1988 | Atwell, Jr. et al. | 318/625 |
| 5,389,838 | 2/1995 | Orengo | 326/93 |
| 5,452,231 | 9/1995 | Butts et al. | |
| 5,465,062 | 11/1995 | Fong | 327/172 |
| 5,469,367 | 11/1995 | Puri et al. | 364/489 |
| 5,515,292 | 5/1996 | Roy et al. | 364/489 |
| 5,542,034 | 7/1996 | Petler | 395/500 |

OTHER PUBLICATIONS

E. Olson and S. M. Kang, State Assigment for low–power FSM synthesis using genetic local search, IEEE 1994 Custom Integrated Circuits Conference, pp. 140–143, 1994.

*Primary Examiner*—Emanuel T. Voeltz
*Assistant Examiner*—Hien Vo
*Attorney, Agent, or Firm*—Rennie William Dover; Ziye Zhou

[57] ABSTRACT

A method for encoding a state machine includes performing a state transition probability analysis (11) to identify hot states (12) and cold states. Then hot (13) and cold (14) states are encoded. The encoding minimizes the expected bit flip (EBF). In addition, a local encoding exploration may be performed to further optimize the encoding of the state machine for area and power consumption. The local encoding exploration preserves the EBF.

17 Claims, 2 Drawing Sheets

METHOD FOR ENCODING A STATE MACHINE

BACKGROUND OF THE INVENTION

The present invention relates, in general, to synthesizing semiconductor circuits, and more particularly, to synthesizing semiconductor digital circuits involving state machine encoding.

An important step in synthesizing digital circuits is the generation of an abstract computational model in which unique binary values are used to represent the states of a digital circuit. This computational model is referred to as a state machine and is generated from a state transition graph or table. The state transition graph identifies the input, output, and next state transitions of the state machine. Further, the assignment of a unique binary value to each state is often referred to as encoding the state machine. As those skilled in the art are aware, the encoding of a state machine affects such circuit attributes as power consumption, circuit area, speed, etc.

There are a large number of possible encodings for state machines having even a small number of bits. A state machine having "m" states to be encoded into "n" bits has $$\prod_{i=0}^{(m-1)} (2^n - i) \qquad \text{EQT. 1}$$

possible number of encodings. Thus, for a machine of 10 states and 4 bits (m=10, n=4) there are more than 29 billion possible encodings, each of which may potentially result in a different circuit implementation. Thus, it would take almost one year to find the best encoding solution if one thousand encodings were evaluated per second. For m=6 and n=3, there are 20,160 possible encodings.

Accordingly, it would be advantageous to have a method for encoding a state machine that includes optimization of the power consumption along with the circuit area.

DETAILED DESCRIPTION OF THE DRAWINGS

Generally, the present invention provides a method for encoding a state machine for use in a logic synthesis tool. The logic synthesis tool generates a circuit implementation of the state machine. In accordance with the present invention, a transition probability analysis is performed on the state machine. The results of the transition probability analysis are used to identify at least one "hot state" of the state machine, which is then encoded. It should be noted that at least one cold state may also be identified and encoded. Encoding in accordance with these embodiments provides an acceptable compromise between the amount of power consumed by a circuit implementation and the amount of area used by the circuit implementation of the state machine, i.e., the area efficiency of the state machine. The power efficiency of a state machine is related to the "Hamming" distance. The "Hamming" distance between two states is the number of bit toggles in their binary representations. For example, a transition from the state "001" to the state "100" has a "Hamming" distance of two because there are two bit flips. Minimizing the "Hamming" distance of a state transition reduces the switching activity in the state machine circuit, leading to less power dissipation associated with the state machine.

Figure 1:
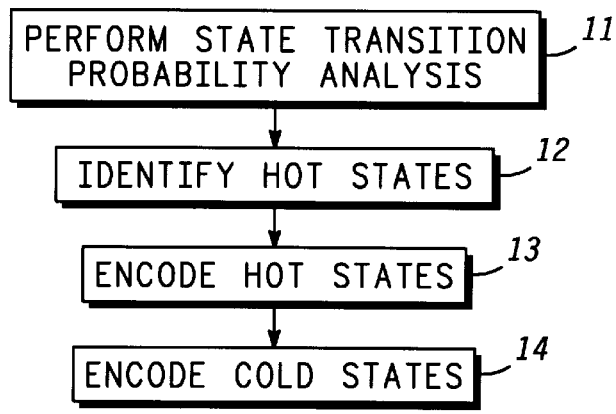
FIG. 1 is a flow diagram of a method for generating a state machine circuit in accordance with an embodiment of the present invention.

FIG. 1 is a flow chart 10 of the method for encoding the state machine in accordance with the first embodiment of the present invention. In a first step 11, a state transition probability analysis is performed. The purpose of this step is to observe the transition probability of each transition at a typical clock cycle. By way of example, the state transition probabilities are obtained from a pre-logic synthesis simulation model of the state machine by performing a cycle-by-cycle state dump of the state machine. In a second step 12, the hot states of the state machine are identified. It should be understood that the transitions of state machines are skewed such that a small number of states dominate the high probability transitions. These states represent only a subset of the states in the state machine and are referred as the hot states of the state machine. In one example, the hot states are defined as the states that are visited by the top-most eighty percent of the transitions. In other words, the transition with the highest probability is selected and the two incident states are labeled hot states. Next, the transition with the second highest probability is selected and the next two incident states are labeled as hot states. This process is continued until the sum of the selected transition probabilities reaches eighty percent. These labeled states represent the hot states. It should be noted that the definition of the hot states is not a limitation of the present invention. In other words, the sum of the selected transition probabilities can be a number other than eighty percent depending on the desired resolution. It should be further noted that in one example, the remaining states, i.e., the states not labeled as hot states, are referred to as cold states. Thus, the total number of states of the state machine is the sum of the hot states and the cold states.

In a third step 13, the hot states are encoded by assigning a unique binary value to each state of the state machine. Preferably, the hot states are encoded such that the expected number of bit flips per clock cycle (EBF) is minimized. The expected number of bit flips per clock cycle is defined as the sum of the products of the Hamming distances and the transition state probabilities. The EBF value depends on the particular state encoding and transition probabilities. EBF is a good indicator of power dissipation when the state machine is synthesized with the given encoding. A machine encoded with lower EBF tends to have lower power dissipation. It should be understood that there may be more than one encoding that yields a minimum value for the EBF. When more than one encoding scheme provides a minimum value for the expected bit flip number, the choice of encoding is arbitrary. Briefly referring to FIG. 2, a state transition diagram 16 is illustrated for a state machine that is encoded with the states "000", "001", and "011". In a transition 21 from state "000" to state "001", there is one bit flip which has a transition probability of 0.15. Likewise, in a transition 22 from state "001" to state "011", there is one bit flip with a transition probability of 0.15. In a transition 23 from state "000" to state "011", there are two bit flips with a transition probability of 0.3, whereas the transition probability of the two bit flips from state "011" to state "000" (reference number 24) is 0.4. Thus, the EBF is given by:

$$EBF=2*(0.3+0.4)+1*(0.15+0.15)=1.7.$$

Figure 2:
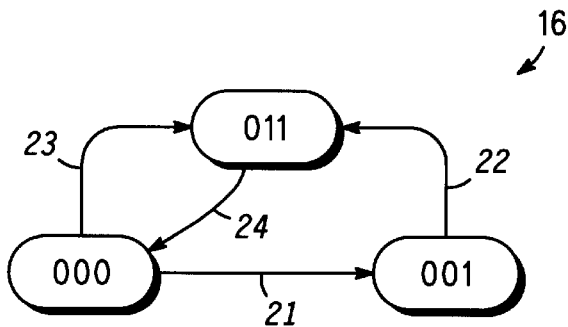
FIG. 2 is a state transition table for use with the method of FIG. 1.
Figure 3:
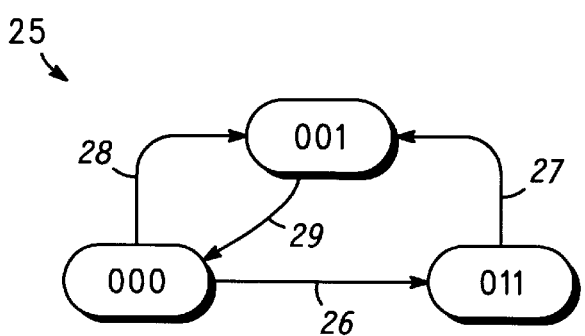
FIG. 3 is another state transition table for use with the method of FIG. 1.

FIG. 3 illustrates another state transition diagram 25 having a different encoding from that of FIG. 2. In a transition 26 from state "000" to state "011", there are two bit flips with a transition probability of 0.15. Likewise, in a transition 27 from state "011" to state "001", there is one bit flip with a transition probability of 0.15. In a transition 28 from state "000" to state "001", there is one bit flip with a transition probability of 0.3, whereas the transition probability of the one bit flip from state "001" to state "000" (reference number 29) is 0.4. Thus, the EBF is given by:

$$EBF=2*(0.15)+1*(0.3+0.4+0.15)=1.15.$$

Thus, the encoding illustrated in FIG. 3 represents a lower EBF than that illustrated in FIG. 2. Therefore, the encoding of FIG. 3 is preferred over that of FIG. 2 because the hot states of the state machine are encoded to minimize EBF and thus power dissipation.

Referring again to FIG. 1, and an accordance with aspect of the first embodiment that is optional, the cold states are also encoded (step 14). By way of example, the cold states are encoded using the automatic encoding feature of the logic synthesis tool. As those skilled in the art are aware, logic synthesis tools convert the description of finite-state machine controllers into a representation of logic primitives and interconnect nets in an input design file. It contains a finite-state machine synthesis tool, which is available commercially from Mentor Graphics Corp., VLSI Technology Inc., Synopsys Inc., and others.

After the hot and cold states have been encoded, the logic synthesis tool is used to implement or generate a circuit from the state machine model. Because the hot states have been encoded for a minimum EBF the circuit is optimized for power consumption. Likewise, encoding the cold states optimizes the amount of area that the circuit uses, since the encoding of cold states has little impact on power dissipation.

Figure 4:
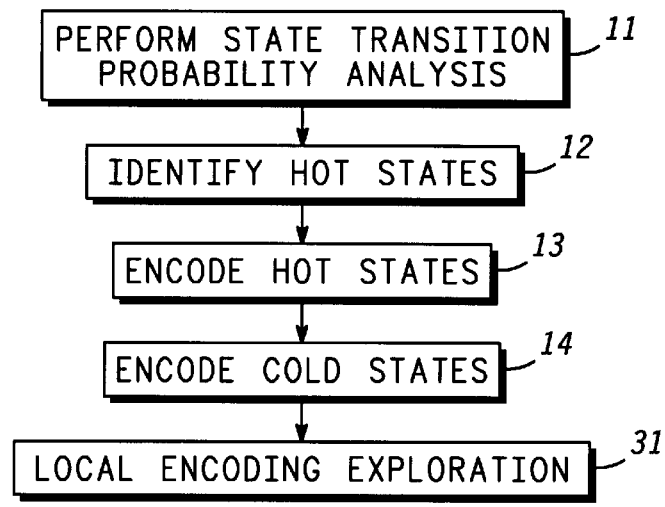
FIG. 4 is a flow diagram of a method for generating a state machine circuit in accordance with another embodiment of the present invention.

FIG. 4 is a flow chart 30 of the method for encoding the state machine in accordance with a second embodiment of the present invention. It should be understood that the same reference numerals are used in the figures to denote the same elements. Thus steps 11, 12, 13, and 14 are the same for the first and second embodiments. It should be further understood that encoding the cold states as described with reference to step 14 of the first and second embodiments is preferable, but optional. In the second embodiment, the encoding of the state machine is refined to improve the power consumption and the area efficiency of the circuit implementation of the state machine by iteratively performing synthesis and cost implementation steps.

Accordingly, the encoding derived at step 14 serves as an "initial encoding" which will be optimized in a "local neighborhood" exploration procedure. It should be understood that to obtain different circuit implementations, different encodings are needed. It is desirable to generate alternative encodings of the state machine, thereby providing different circuit implementations. However, a randomly generated encoding exploration procedure is not desirable because of the large number of possible encodings as shown by EQT. 1. It should be noted that the encoding from step 14 represents a desirable compromise between the power consumption and the area of the state machine. Thus, it is desirable to explore alternate encodings without deviating too much from the initial encoding. It should be noted that the various encodings explored by this method have similar EBF values. Preferably, these EBF values of the various encodings are the same.

In accordance with the second embodiment, an iterative analysis 31 is performed wherein some of the bits of the initial encoding are complemented and some of the bits of the initial encoding are permuted to obtain new encodings. Examples of this step, which is also referred to as "local encoding exploration," are described infra. After each new encoding is obtained, a circuit implementation is generated from the new encoding, or encoding information, using the logic synthesis tool. The circuit is analyzed to determine its power and area requirements as well as the cost of the implementation. This process is repeated until most or all of the new encodings that have been generated by complementation and permutation have been implemented as a logic circuit, using a logic synthesis tool, and analyzed for power consumption and size, i.e., area. It is desirable to select the circuit implementation that is the least expensive to manufacture, while consuming the least power and area as a final design.

Figure 5:
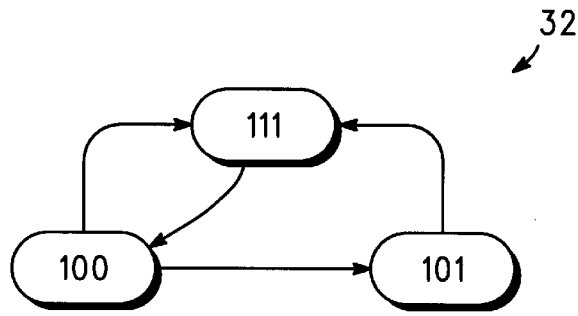
FIG. 5 is a state transition table in accordance with an embodiment of the present invention using complementation.
Figure 6:
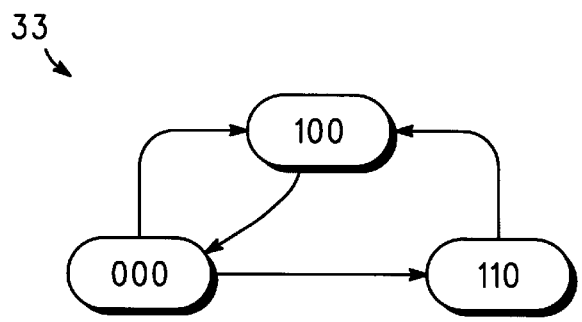
FIG. 6 is a state transition table in accordance with an embodiment of the present invention using permutation.

By way of example and assuming the encoding of FIG. 3 is the initial encoding, the first iteration may be performed on the initial encoding using complementation, wherein the left most bit of the original encoding has been complemented to generate an alternate encoding, also referred to as a complemented encoding. The second iteration may be performed on the initial encoding using permutation wherein the outer two bits of the initial encoding have been permuted to generate another new encoding, referred to as a permuted encoding. It should be noted that the particular bits that are complemented and permuted are not limitations of the present invention. Briefly referring to FIG. 5, a complemented encoding scheme 32 is illustrated, wherein the left most bits are complemented. Briefly referring to FIG. 6, a permuted encoding scheme 33 is illustrated, wherein the left and right most bits are permuted. This iterative technique could continue until all the combinations of complemented and permuted encodings have been analyzed.

It should be noted that for an n-bit machine, there are $2^n$ complement and n! permutation operations. Thus, the number of iterations grows exponentially with the bit size of the state machine. To further illustrate the number of iterations as a function of bit size, TABLE 1 illustrates the number of operations and iterations as a function of the number of bits.

TABLE 1

| Number of bits (n) | $2^n$ | n! | $2^n$ + n! |
| --- | --- | --- | --- |
| 2 | 4 | 2 | 6 |
| 3 | 8 | 6 | 14 |
| 4 | 16 | 24 | 40 |
| 5 | 32 | 120 | 152 |
| 6 | 64 | 720 | 784 |
| 7 | 128 | 5040 | 5168 |
| 8 | 256 | 40320 | 40576 |

Thus, for larger state machines, the number of iterations becomes very large. Accordingly, in a third embodiment, the local area encoding is performed using encodings that have only been complemented. In yet a fourth embodiment, the local area encoding is performed using encodings that have only been permuted. It should be understood that the present invention is not limited to encodings that have been generated using complementation and permutation. Other suitable encoding exploration schemes that preserve the EBF may be used.

By now it should be appreciated that a method for encoding a state machine has been provided. The method includes encoding the state machine by minimizing the EBF, thereby minimizing the power consumption of the circuit implementation. Further, the method includes an iterative technique, known as local encoding exploration, that allows optimizing the circuit implementation for area while simultaneously optimizing the circuit for power consumption. The best or most desired circuit implementation among all generated circuit implementations in the local encoding exploration is chosen as the final design. Another advantage of the present invention is that the local exploration procedure using the complementation and permutation operations preserves the EBF of the initial encoding.

I claim:

1. A method for encoding a state machine, comprising the steps of:
   performing a transition probability analysis on the state machine;
   identifying at least one hot state using the transition probability analysis; and
   providing an initial encoding by performing at least the step of encoding the at least one hot state.

2. The method of claim 1, wherein the step of providing an initial encoding further includes the steps of:
   identifying at least one cold state using the transition probability analysis; and
   encoding the at least one cold state.

3. The method of claim 2, further comprising the step of performing a local encoding exploration on the initial encoding.

4. The method of claim 1, wherein the step of performing a transition probability analysis on the state machine includes providing an encoding for the state machine.

5. The method of claim 1, further comprising the step of performing a local encoding exploration on the initial encoding of the at least one hot state.

6. The method of claim 5, wherein the step of performing a local encoding exploration includes performing a complementation operation and a permutation operation on the initial encoding.

7. A method for encoding a state machine, comprising the steps of:
   performing a transition probability analysis on the state machine;
   identifying a first hot state and a second hot state from the transition probability analysis;
   generating an initial encoding by performing at least the steps of encoding the first hot state and encoding the second hot state to minimize a Hamming distance for a transition between the first hot state and the second hot state;
   performing a local encoding exploration on the initial encoding of the first hot state and the second hot state to generate a first encoding; and
   generating a circuit implementation from the first encoding.

8. The method of claim 7, wherein the step of performing a local encoding exploration includes performing a complementation operation on the initial encoding.

9. The method of claim 7, wherein the step of performing a local encoding exploration includes performing a permutation operation on the initial encoding.

10. The method of claim 9, wherein the step of performing a local encoding exploration further includes performing a complementation operation on the initial encoding.

11. The method of claim 7, wherein the step of generating an initial encoding further includes the steps of:
    identifying a cold state from the transition probability analysis; and
    encoding the cold state.

12. The method of claim 7, wherein the step of performing a local encoding exploration further includes the steps of:
    iteratively performing the local encoding exploration to generate a second encoding; and
    generating another circuit implementation from the second encoding.

13. A method for generating a circuit, comprising the steps of:
    performing a transition probability analysis on state transitions;
    using the transition probability analysis to identify a plurality of hot states;
    encoding the plurality of hot states to minimize a Hamming distance for a transition between the plurality of hot states; and
    generating the circuit in accordance with encoding information of the plurality of hot states.

14. The method of claim 13, wherein the circuit is a logic circuit.

15. The method of claim 13, wherein the step of performing a transition probability analysis includes assigning an encoding to a state machine.

16. The method of claim 13, wherein the step of using the transition probability analysis to identify a plurality of hot states further includes identifying at least one cold state.

17. The method of claim 16, wherein:
    the step of encoding the plurality of hot states further includes encoding the at least one cold state; and
    the step of generating the circuit further includes generating the circuit in accordance with encoding information from the plurality of hot states and the at least one cold state.

* * * * *